United States Patent
Mouli (10) Patent No.: US 7,522,341 B2
(45) Date of Patent: Apr. 21, 2009

(54) SHARING OF MICROLENSES AMONG PIXELS IN IMAGE SENSORS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 11/178,804

(22) Filed: Jul. 12, 2005

(65) Prior Publication Data
US 2007/0014019 A1   Jan. 18, 2007

(51) Int. Cl.
G02B 27/10 (2006.01)
(52) U.S. Cl. ............................. 359/619; 359/626
(58) Field of Classification Search ......... 359/618–622, 359/626, 628
See application file for complete search history.

(56) References Cited

U.S. PATENT DOCUMENTS

| | | | |
|---|---|---|---|
| 5,519,539 A | 5/1996 | Hoopman et al. | |
| 5,965,875 A | 10/1999 | Merrill | |
| 6,307,243 B1 | 10/2001 | Rhodes | |
| 6,381,072 B1 | 4/2002 | Burger | |
| 6,734,031 B2 * | 5/2004 | Shizukuishi | 438/22 |
| 6,744,032 B1 | 6/2004 | Tay | |
| 6,819,360 B1 * | 11/2004 | Ide et al. | 348/340 |
| 6,958,862 B1 * | 10/2005 | Joseph | 359/621 |
| 7,138,663 B2 * | 11/2006 | Hoshuyama | 257/98 |
| 2004/0100570 A1 * | 5/2004 | Shizukuishi | 348/272 |
| 2004/0178478 A1 * | 9/2004 | Shizukuishi | 348/273 |
| 2004/0183937 A1 | 9/2004 | Viinikanoja et al. | |
| 2005/0057664 A1 | 3/2005 | Palum et al. | |
| 2005/0087829 A1 | 4/2005 | Merrill et al. | |
| 2005/0225654 A1 * | 10/2005 | Feldman et al. | 348/272 |

OTHER PUBLICATIONS

Christopher J. Campbell et al., "Arrays of microlenses of complex shapes prepared by reaction-diffusion in thin films of ionically dooped gels", Sep. 13, 2004, Applied Physics Letters.
Daniel M. Hartmann et al., "Optimization and theoretical modeling of polymer microlens arrays fabricated with the hydrophobic effect", Applied Optics, vol. 40, No. 16, Jun. 1, 2001.
Mao-Kuo Wei et al., "Real-time Observation for the Formation of Microlens Arrays Fabricated Using Thermal Reflow Process", Tamkang Journal of Science and Engineering, vol. 7, No. 2, pp. 81-86 (2004).

* cited by examiner

*Primary Examiner*—Alicia M Harrington
(74) *Attorney, Agent, or Firm*—Dickstein Shapiro LLP (57) ABSTRACT

A microlens array having microlenses that correspond to more than one color filter and underlying pixel. In one particular embodiment, each microlens is formed to cover one Bayer pattern set, out of a plurality of repeated sets over an entire color filter and pixel array. A semiconductor-based imager includes a pixel array having embedded pixel cells, each with a photosensor, and a microlens array having microlenses that cover more than one embedded pixel cell.

33 Claims, 7 Drawing Sheets

SHARING OF MICROLENSES AMONG PIXELS IN IMAGE SENSORS

FIELD OF THE INVENTION

The invention relates generally to the field of semiconductor-based imager devices using microlenses, and more particularly to the fabrication of an array of microlenses for said devices.

BACKGROUND OF THE INVENTION

Solid state imagers, including charge coupled devices (CCD) and CMOS imagers, have been used in photo imaging applications. A solid state imager circuit includes a focal plane array of pixel cells, each one of the cells including a photosensor, which may be a photogate, photoconductor or a photodiode having a doped region for accumulating photo-generated charge. Microlenses are placed over imager pixel cells to focus light onto the initial charge accumulation region of the photosensor.

In conventional imager devices, incoming photons of light en route to the photosensitive parts of the pixel pass through a color filter array (CFA) used to obtain color signals for the inherently monochrome image device. To get color signals out of an image device requires pixel cells which separately detect red (R), green (G), and blue (B) photons of received light. To do this, each pixel of the imager device is covered with either a red, green, or blue filter, according to a specific pattern. A conventional color pattern for a color filter array used in today's imager devices, known as the Bayer pattern, is shown in FIG. 1.

Figure 1:
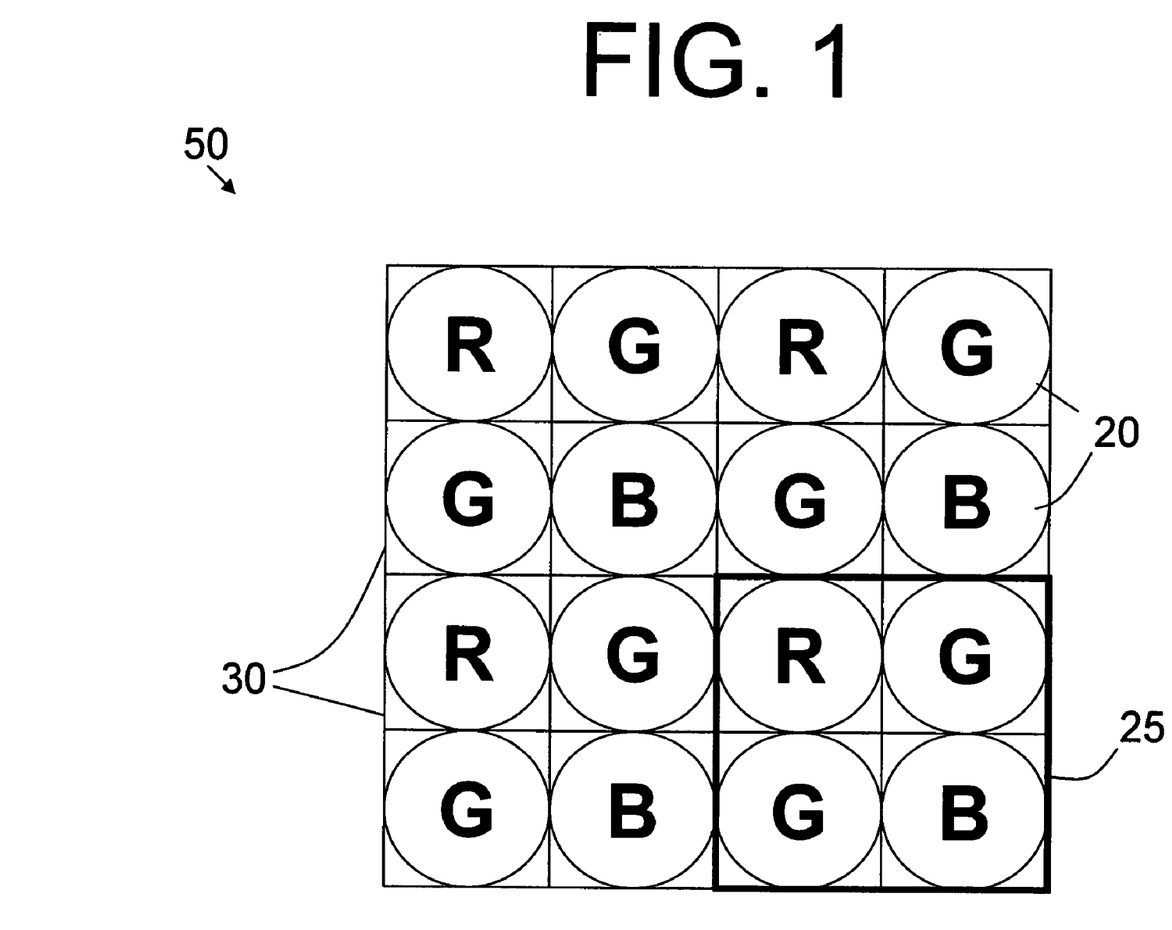
FIG. 1 is a top-down view of a conventional microlens array covering a pixel array.

As shown in a top-down view of FIG. 1, the Bayer pattern includes a 2-by-2 set 25 of pixels arranged in a repeating pattern over the entire pixel array 50. Every other row consists of alternating Red (R) and green (G) colored pixels cells, while the other row consists of alternating Green (G) and blue (B) color pixels. In conventional imager devices, one microlens 30 is formed over each individual pixel 20 as shown in FIG. 1. When an image sensor utilizing a Bayer pattern color filter array is read out, line by line, the pixel sequence comes out RGRGR, etc., and then the alternate line sequence is GBGBG, etc. This output is called sequential RGB (or sRGB).

Use of microlenses significantly improves the photosensitivity of the imager device by collecting light from a large light collecting area and focusing it onto a small photosensitive area of the photosensor. However, as the size of imager arrays and photosensitive regions of pixels continue to decrease, due to desired scaling, it becomes increasingly difficult to provide a microlens capable of efficiently focusing incident light rays onto the photosensitive regions of the pixel cell. Both the optical and electrical performance of the imager device may suffer with lens scaling. This problem is due in part to the increased difficulty in constructing a microlens that has the optimal focal characteristics for the increasingly smaller imager device. Beyond an optimal size for a microlens, further scaling down of the microlenses causes the light gathering power of the lenses to drop off significantly.

Scaled microlenses may have a negative impact on both the internal and external quantum efficiency of imager devices using the smaller microlenses. Microlenses are diffraction limited, as the angular resolution of every microlens is inversely proportional to the diameter of the lens. The diffraction limit fundamentally affects the quality of an image reproduced by an imager device. Accordingly, it is desirable to form a microlens array that can be used with scaled pixels without suffering the drawbacks of conventional, scaled microlenses.

BRIEF SUMMARY OF THE INVENTION

Exemplary embodiments of the invention provide an improved microlens array for an imager device. The microlens array includes a series of microlenses formed to cover more than one underlying pixel. In one embodiment where a Bayer-patterned color filter array is utilized, one microlens covers a 2-by-2 Bayer pattern set (RG/GB) of color filters and pixels. In another embodiment, a cylindrical lens is used to cover one half of a Bayer pattern set (RG or GB) of color filters and pixels.

An exemplary semiconductor-based imager embodiment of the invention includes a pixel array and a microlens array. The pixel array has embedded color pixel cells, each with a photosensor. The microlens array has microlenses that cover more than one of the corresponding color pixels.

BRIEF DESCRIPTION OF THE DRAWINGS

The foregoing and other advantages and features of the invention will be more readily understood from the following detailed description of the invention provided below with reference to the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "wafer" or "substrate" as used herein, is to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor device and associated structures for converting photons to an electrical signal. For purposes of illustration, a representative three-color R, G, B pixel array is illustrated in the figures and description herein; however, the invention is not limited to the use of an R, G, B array, and can be used with other color arrays, one example being C, M, Y, K (which represents cyan, magenta, yellow and black color filters). In addition, the invention can also be used in a mono-chromatic array where just one color is sensed by the array. Accordingly, the following detailed description is not to be taken in a limiting sense, and the scope of the present invention is defined not by the illustrative embodiments, but by the scope of the appended claims.

It should also be understood that, taken alone, a pixel does not distinguish one incoming color of light from another and its output signal represents only the intensity of light received, not any identification of color. For purposes of this disclosure, however, pixels will be referred to by color (i.e., "red pixel," "blue pixel," etc.) when a color filter is used in connection with the pixel to focus a particular wavelength of light, corresponding to a particular color, onto the pixel. For example, when the term "red pixel" is used herein, it is referring to a pixel with a red color filter that filters wavelengths of light within a wavelength range encountered at about 650 nm to the underlying pixel. Similar wavelength ranges exist for the "blue" and "green" pixels which are centered about a respective blue and green wavelength for each.

Finally, while the invention is described with reference to a semiconductor-based imager, such as a CMOS imager, it should be appreciated that the invention may be applied in any micro-electronic or micro-optical device that requires high quality microlenses for optimized performance. Other exemplary micro-optical devices that can employ the invention include CCD imagers and display devices as well.

Figure 2:
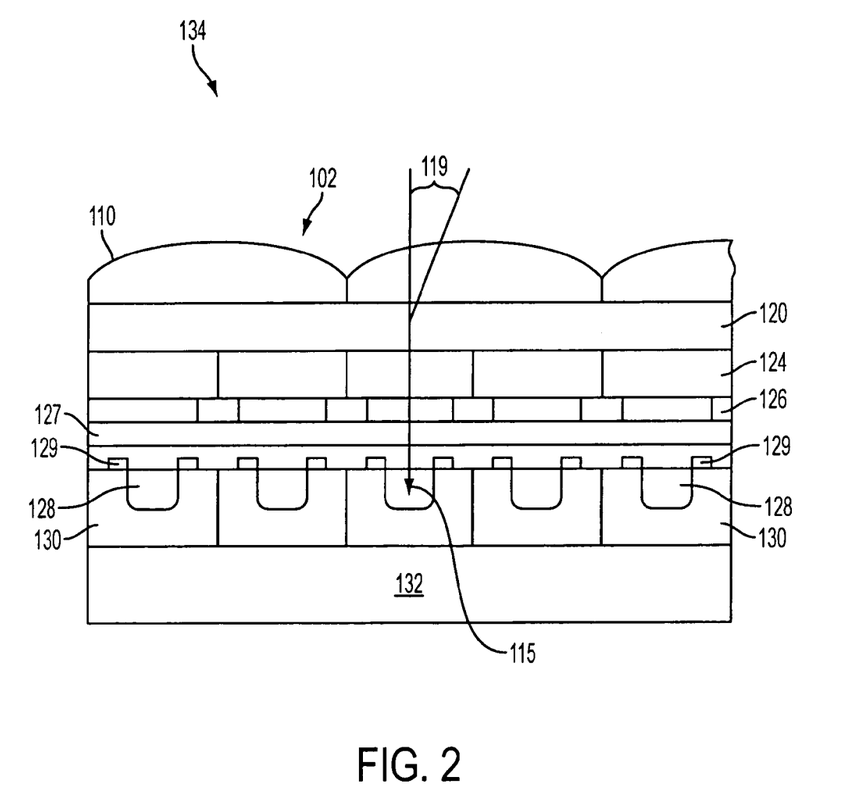
FIG. 2 is a cross-sectional view of an imager utilizing a microlens array in accordance with an exemplary embodiment of the invention.

Now, with reference to the Figures, where like numbers represent like elements, FIG. 2 illustrates a part of a semiconductor-based imager 134, such as a CMOS imager. The imager 134 includes a microlens array 110, with a plurality of microlenses 102 formed on a receiving surface 120 of the imager 134. Beneath the microlens array 110 is a color filter array 124, a light shield layer 126, at least one inter-level dielectric (ILD) layer 127, which also may encompass metal wiring interconnects (not shown), and pixel cells 130 fabricated on a substrate 132. Additional layers, such as additional BPSG and ILD layers may also be a part of the imager 134 as known in the art. Each pixel 130 includes transistors 129 and a photosensor 128, which may be any type of photosensor, including but not limited to a photogate or photodiode. The light shield 126 and metallization layers may be used to block light from reaching the other light sensitive parts of the pixels 130, so that incident light is directed mainly to the photosensors 128.

Figure 3:
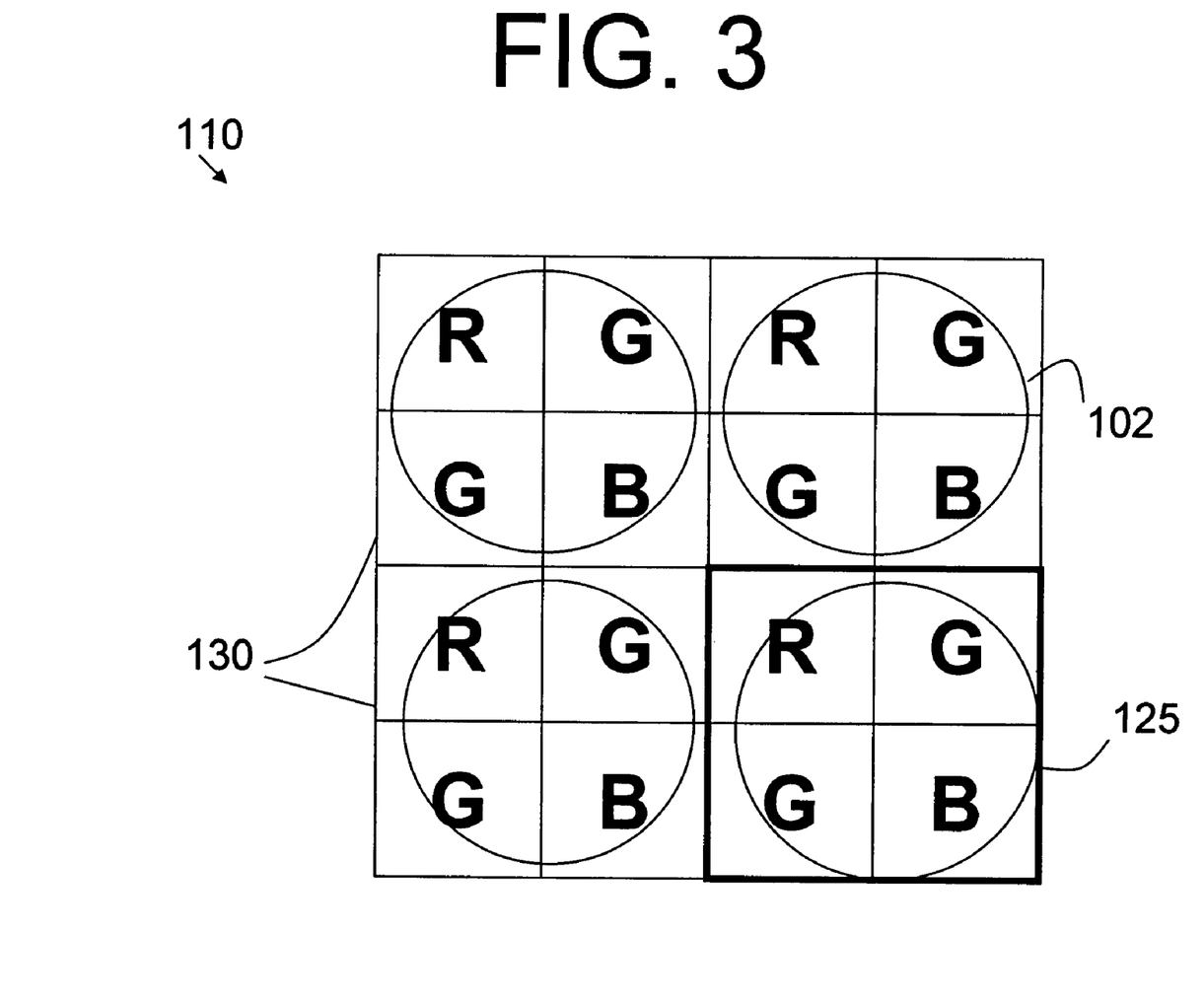
FIG. 3 is a top-down view illustrating a portion of an exemplary microlens array in accordance with a first exemplary embodiment of the invention.

As shown in FIG. 2, each microlens 102 in accordance with the invention, corresponds to more than one pixel cell 130 in the underlying pixel array. Turning to FIG. 3, a top-down view of the microlens array 110 in accordance with the invention is shown. The microlens array 110 is shown as overlying a Bayer pattern (RG/GB) color filter pattern, however, other color filter patterns are also within the scope of the invention.

Unlike the conventional microlens array 50 shown in FIG. 1, the microlens array 110 in accordance with the invention, has one microlens 102 for each 2-by-2 Bayer set of pixels 125. One full Bayer set 125, as highlighted in FIG. 3, includes two green pixels (G), a blue pixel (B), and a red pixel (R). For improving simplicity in fabricating the microlens array 110, each microlens 102 may have the same focusing characteristics such as focal length. Thus, the imager 134 (FIG. 2) relies on the microlens array 110 to focus the incoming light 119 through the color filter array 124 to focus light of particular wavelength ranges onto the underlying pixel photosensors 128. The focal characteristics of each microlens 102 is preferably adjusted such that it is relatively well optimized for each of the red, green, and blue pixels. In a preferred embodiment, each microlens 102 is a spherical lens, however, other lens shapes are also within the scope of the invention.

A microlens array 110 in accordance with the present invention has several potential advantages. Most importantly, the microlens array 110 should enable significant scaling of pixels 130 without diminishing the efficiency of the microlens array 110 because the size of the microlenses 102 does not need to be as small as that of the underlying pixels 130. In fact, the invention can be implemented with sub-2 micron pixels 130.

Accordingly, the manufacturing of the microlenses is also simple as bigger microlenses are generally simpler to manufacture. In addition, both the external and internal quantum efficiency of the imager 134 utilizing the microlens array 110 should be improved. Specifically, resonant characteristics in the electric fields in the reverse-biased photo-sensing regions can be avoided, improving the internal quantum efficiency of the imager 134.

Figure 4A:
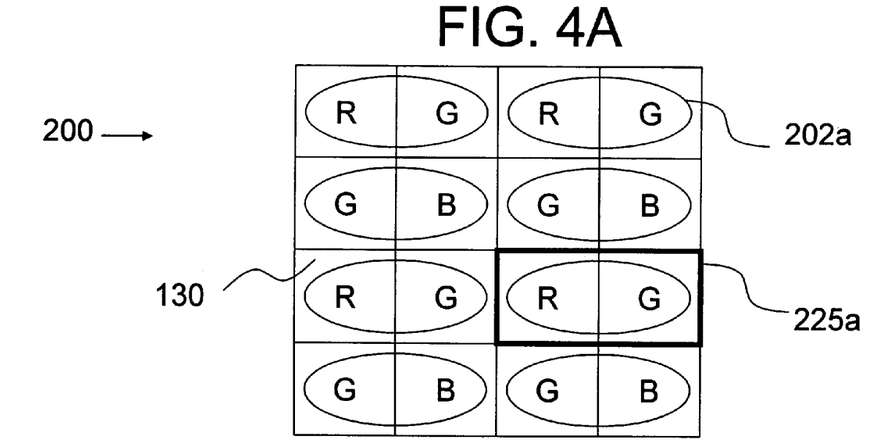
FIG. 4a is a top-down view illustrating a portion of an exemplary microlens array in accordance with a second exemplary embodiment of the invention.
Figure 4B:
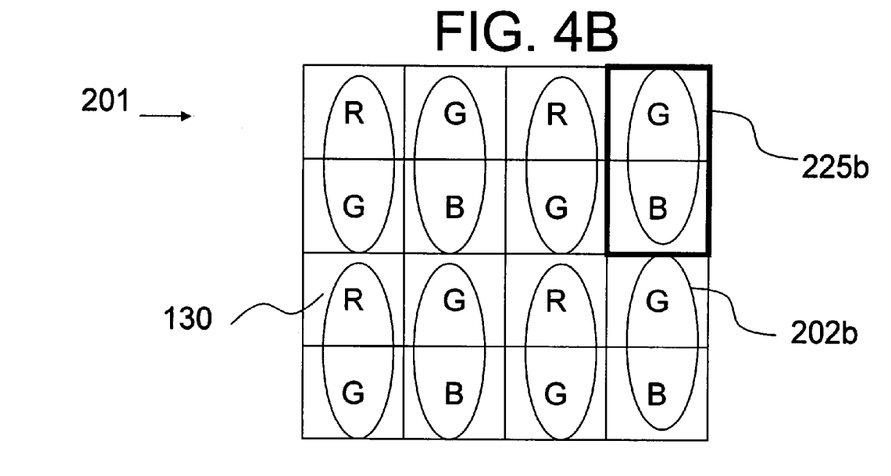
FIG. 4b is a top-down view illustrating a portion of an exemplary microlens array in accordance with a third exemplary embodiment of the invention.

Turning now to FIGS. 4A and 4B, second and third exemplary embodiments of microlens arrays in accordance with the invention are respectively shown in top-down view. FIG. 4A shows a microlens array 200 having a plurality of microlenses 202a. Each microlens 202a covers more than one underlying pixel 130, and it should be understood that each microlens may cover more than one underlying color filter 124, each filter 124 associated with a pixel 130. In accordance with the second exemplary embodiment, covers one half of a Bayer patter 225a, which is a one-by-two pixel pair. As shown, the microlenses are formed in what appears as an oval shape in top-down view. The oval-shaped lenses 202a better matches the shape of the sensing area of the underlying pixels 130. Specifically, where four pixels 130 in a two-by-two pattern, shared one lens 102 (FIG. 3), the underlying shape was square-like, and a circular microlens 102 fit well with this pattern. Where the underlying pixels are more rectangular, in a one-by-two pattern, an oval-shaped microlens 202a is better suited to cover this photosensing area. Preferably, these microlenses 202a are formed in a cylindrical shape, and as stated before, each microlens 202a can be formed to have an identical focal length.

FIG. 4B shows a microlens array 201 formed in accordance with a third exemplary embodiment and having a plurality of microlenses 202b. Like the microlenses 202a (FIG. 4A), each microlens 202b in accordance with the third embodiment covers one half of a Bayer pattern set of pixels 225b. The difference between microlenses 202a and 202b is only the orientation of the lenses 202a, 202b. Specifically, lenses 202a are shown as covering row-adjacent pixel pairs in a half-Bayer pattern 225a, while microlenses 202b cover column-adjacent pixels in a half-Bayer pattern 225b. Like microlenses 202a, microlenses 202b are preferably formed in a cylindrical shape.

Figure 5A:
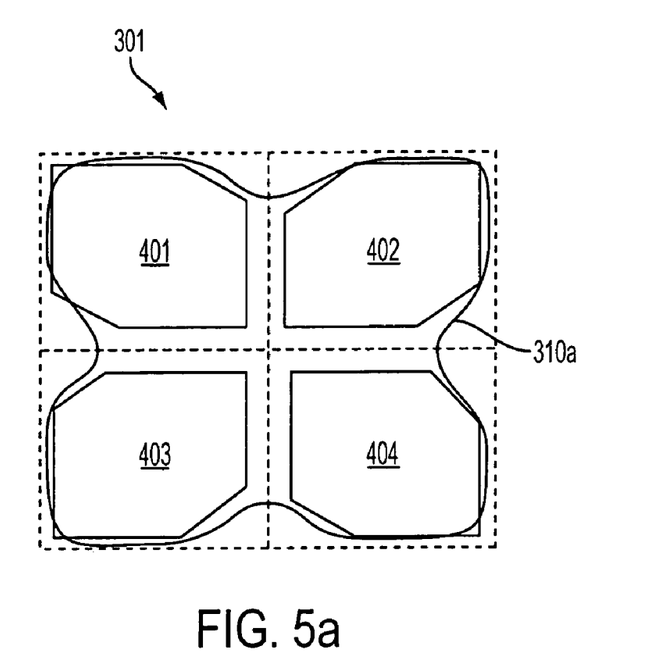
FIG. 5a is a top-down vie illustrating a portion of an exemplary microlens array covering a portion of an exemplary pixel array in accordance with a fourth exemplary embodiment of the invention.
Figure 5B:
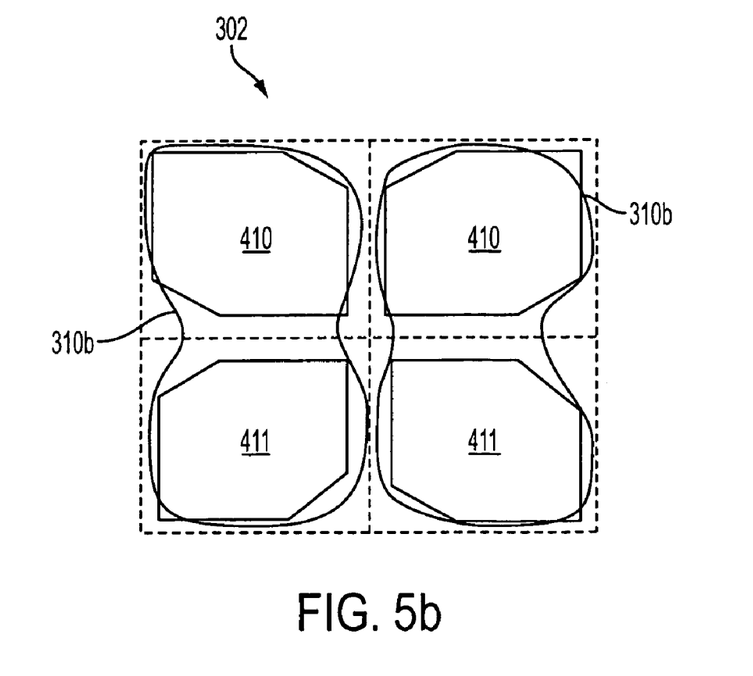
FIG. 5b is a top-down vie illustrating a portion of an exemplary microlens array covering a portion of an exemplary pixel array in accordance with a fifth exemplary embodiment of the invention.

Turning to FIGS. 5a and 5b, two further exemplary embodiments of the invention are shown in top-down view. Portions of exemplary microlens arrays 301, 302 are depicted respectively in FIG. 5 and FIG. 5b. In the area beneath the microlenses, pixel cells (shown in outline form by dashed lines) are formed containing photosensitive regions (401, 402, 403, 404, 410, 411) as shown in FIGS. 5a and 5b. The microlens array 301 has a plurality of microlenses 310a, that are in a butterfly-like shape as to cover four adjacent photosensitive regions 400, 401, 402, and 403, by shadowing the boundary of the four photosensitive regions 400, 401, 402, and 403 as closely as possible. The microlens array 302 has a plurality of microlenses 310b that are formed in a peanut-like shape as to cover two adjacent photosensitive regions 410, 411. In either case, the microlenses 310a or 310b, are formed in a shape that generally traces the shape of the underlying photosensitive regions that share the microlenses 310a, 310b. It should be understood that the two microlens shapes shown are exemplary, as the possible shapes of photosensitive regions is endless; and the preferred embodiments of this invention would reflect the shaping of the photosensitive regions of a pixel array of which a microlens array is used in connection therewith. The curvature of these lenses 310a, 310b could be cylindrical, spherical, or some combination thereof, depending on the shape of the boundary.

The microlenses 102, 202a, 202b, 310a, and 310b of the invention can be fabricated using known fabrication techniques, for purposes of simplification, an exemplary technique for fabricating microlenses 102 will now be described. A microlens material can be deposited onto a receiving surface 120 (FIG. 2) using a microlens pattern. Any microlens material, such as photoresist MFR-401, manufactured by Japan Synthetic Rubber Company, may be used. In addition, any microlens pattern can be utilized in shaping the microlenses as desired, so long as the formed microlenses will cover more than one underlying, embedded pixel 130. In the patterning step, a thin film of microlens material of a predetermined thickness is coated on the receiving surface 120.

It should be noted that the thickness of the material may impact the focusing characteristics of the lenses 102 being fabricated. As previously stated, for improving simplicity in fabrication of the microlens array 110, each microlens 102 may have the same focal length. Thus, the same approximate thickness of microlens material should coat the receiving surface 120 under which each pixel 130 is formed. If, on the other hand, different focal lengths are desired, the material thicknesses deposited on the receiving surface 120 in this step should be altered such that the material is thicker over certain pixels 130 than over others.

The microlens material is next exposed using a suitable mask; and it is developed to either dissolve the exposed microlens material (positive resist) or dissolve the unexposed microlens material (negative resist). The mask may be a flat glass receiving surface on which a pattern of chromium has been evaporated. The pattern of chromium defines the UV light field to be transmitted to the microlens material. Other types of masks may be used, such as variable transmission masks, as will be recognized by one of ordinary skill in the art.

Depending on the type of photoresist material chosen, a bleaching step may be performed to expose the microlens material to ultraviolet radiation, to modify the reflow response of the material. Next, the material is subject to a reflow process and cured to form the microlenses 102. The reflow may be performed using conventional techniques. At this point, the microlenses 102 are solid and will not be affected by the subsequent fabrication steps.

Figure 6:
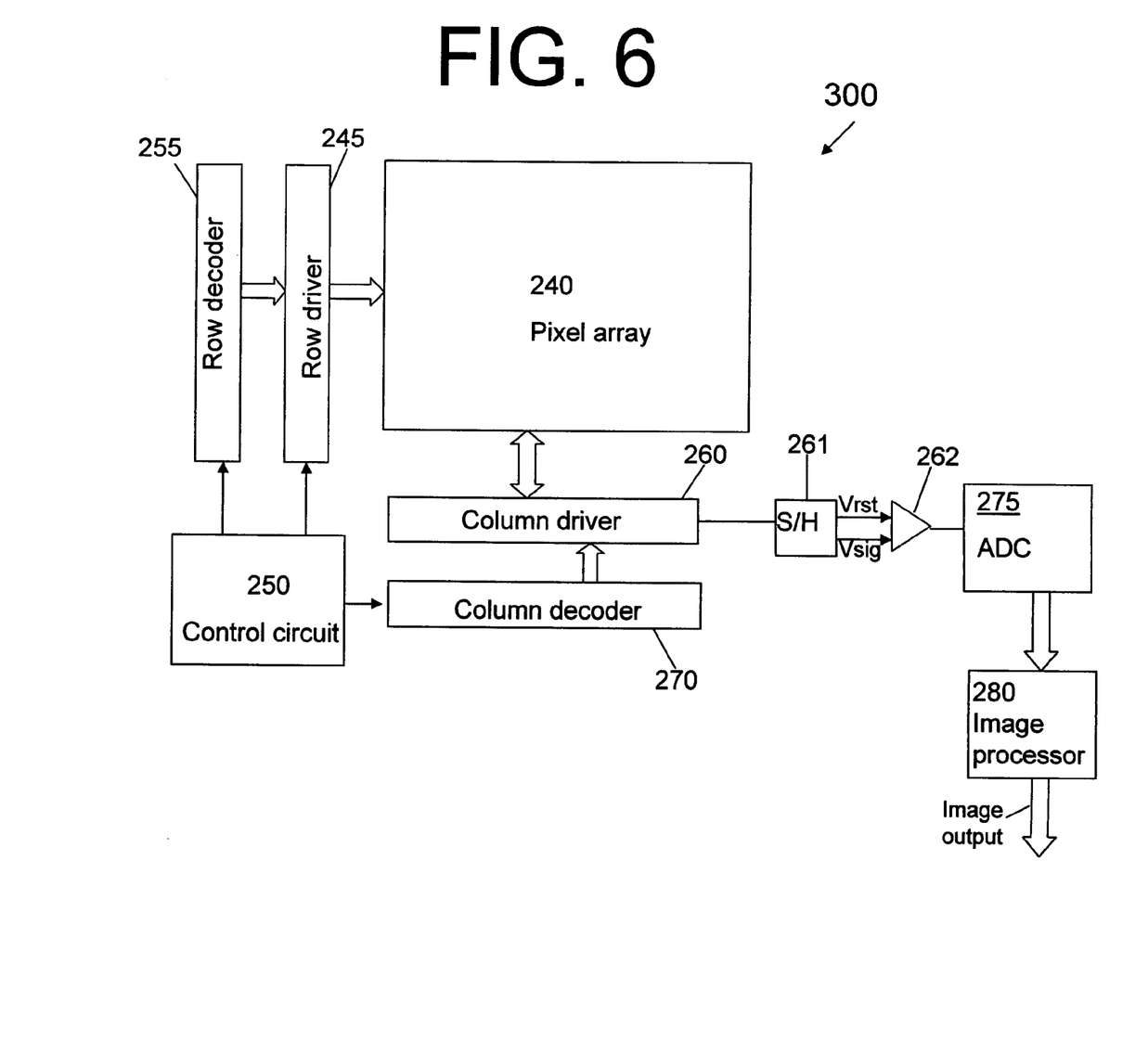
FIG. 6 shows a block diagram of an imager having a microlens array constructed in accordance with an exemplary embodiment of the invention.

FIG. 6 illustrates an exemplary imaging device 300, which may have a pixel array 240 comprising pixels and a microlens array constructed in accordance with one of the exemplary embodiment described above. Row lines of the array 240 are selectively activated by a row driver 245 in response to row address decoder 255. A column driver 260 and column address decoder 270 are also included in the imaging device 300. The imaging device 300 is operated by the timing and control circuit 250, which controls the address decoders 255, 270. The control circuit 250 also controls the row and column driver circuitry 245, 260.

A sample and hold circuit 261 associated with the column driver 260 reads a pixel reset signal Vrst and a pixel image signal Vsig for selected pixels of the array 240. A differential signal (Vrst−Vsig) is produced by differential amplifier 262 for each pixel and is digitized by analog-to-digital converter 275 (ADC). The analog-to-digital converter 275 supplies the digitized pixel signals to an image processor 280 which forms and may output a digital image.

Figure 7:
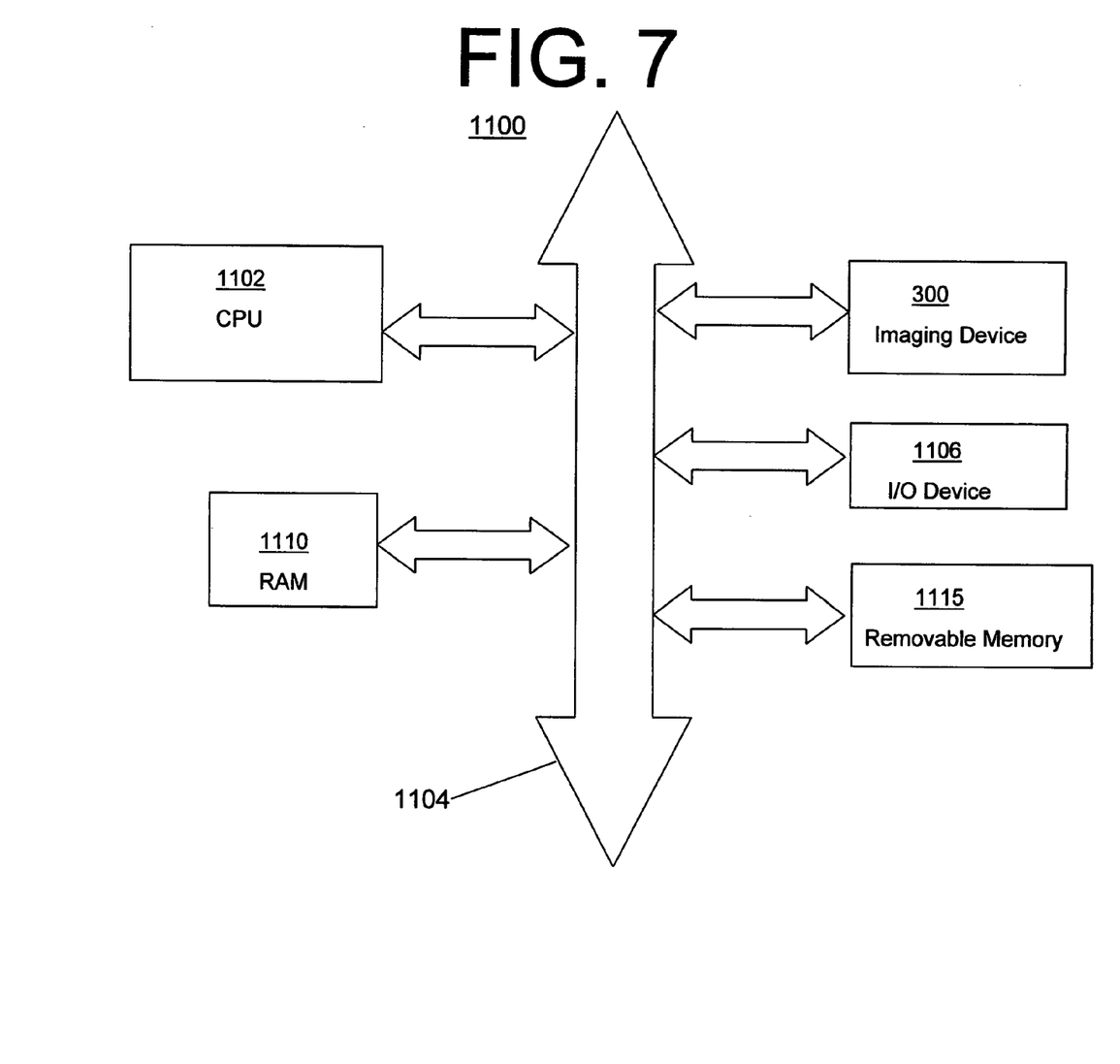
FIG. 7 shows a processor system incorporating at least one imaging device including a microlens array constructed in accordance with an embodiment of the invention.

FIG. 7 shows system 1100, a typical processor system modified to include the imaging device 300 (FIG. 6) of the invention. The system 1100 is exemplary of a system having digital circuits that could include image sensor devices. Without being limiting, such a system could include a computer system, still or video camera system, scanner, machine vision, video phone, and auto focus system, or other imager applications.

System 1100, for example a camera system, generally comprises a central processing unit (CPU) 1102, such as a microprocessor, that communicates with an input/output (I/O) device 1106 over a bus 1104. Imaging device 300 also communicates with the CPU 1102 over the bus 1104. The processor-based system 1100 also includes random access memory (RAM) 1110, and can include removable memory 1115, such as flash memory, which also communicate with the CPU 1102 over the bus 1104. The imaging device 300 may be combined with a processor, such as a CPU, digital signal processor, or microprocessor, with or without memory storage on a single integrated circuit or on a different chip than the processor.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, the invention can be used in display devices where light is being radiated by pixels through microlenses. Accordingly, the invention is not to be seen as limited by the foregoing description, but is only limited by the scope of the appended claims.

What is claimed as new and desired to be protected by Letters Patent of the United States is:

1. A microlens array comprising:
   a color filter array comprising a plurality of sets of color filters, each set comprising at least three color filters respectively passing different wavelengths of visible light;

a first microlens covering more than one pixel and further covering at least two color filters having a first color pattern of less than the at least three color filters of a set; and a second microlens covering at least two color filters having a second different color pattern of less than the at least three color filters of the set.

2. The microlens array of claim 1, wherein the set is repeated across the pixel array.

3. The microlens array of claim 2, wherein the set is a Bayer pattern set of green, red, blue, and green pixels.

4. The micro lens array of claim 2, wherein the first microlens covers exactly one half of a Bayer pattern set.

5. The microlens array of claim 1, wherein each of the plurality of microlenses has an equal focal length.

6. The microlens array of claim 1, wherein the first and second microlenses have different focal lengths.

7. The microlens array of claim 1, wherein the microlens array is part of an imager.

8. The microlens array of claim 1, wherein the microlens array is part of a display device.

9. The microlens array of claim 1, wherein the first microlens covers exactly two pixels.

10. An imager comprising:
a pixel array comprising a plurality of pixels, each having a photosensor;
a color filter array comprising a plurality of sets of color filters, each set comprising at least three color filters respectively passing different wavelengths of visible light,
each color filter corresponding to one pixel;
a microlens array formed over the pixel array, said microlens array comprising a first microlens covering more than one pixel and further covering at least two color filters having a first color pattern of less than the at least three color filters of a set and a second microlens covering at least two color filters having a second different color pattern of less than the at least three color filters of the set.

11. The imager of claim 10, wherein the color filter array comprises a Bayer color filter array pattern.

12. The imager of claim 11, wherein the set of color filters is a Bayer pattern set.

13. The imager of claim 11, wherein each microlens is spherically-shaped.

14. The imager of claim 11, wherein each microlens covers exactly one half of a Bayer pattern set.

15. The imager of claim 14, wherein each microlens is cylindrically-shaped.

16. The imager of claim 10, wherein the imager is a CMOS imager.

17. The imager of claim 10, wherein the imager is a CCD imager.

18. The imager of claim 10, wherein the shape of each microlens is substantially the same as a shape of the photosensors that are underneath the microlens.

19. The imager of claim 18, wherein the microlens is formed in a peanut shape to cover two underlying photosensors.

20. The imager of claim 10, wherein the first microlens covers exactly two pixels.

21. An image processing system comprising:
a processor; and
an imager connected to the processor and comprising:
a substrate having a plurality of pixel cells formed thereon, each pixel cell having a photosensor;
a color filter array comprising a plurality of sets of color filters, each set comprising at least three color filters respectively passing different wavelengths of visible light and corresponding to an underlying pixel; and
a microlens array formed over the pixel cells and comprising a plurality of microlenses, said plurality of microlenses comprising a first microlens covering more than one color filter having a first color pattern of less than the at least three color filters of a set and more than one pixel and a second microlens covering more than one color filter having a second different color pattern of less than the at least three color filters of the set.

22. The system of claim 21, wherein the color filter array is a Bayer pattern.

23. The system of claim 21, wherein the imager is a CMOS imager.

24. The system of claim 21, wherein the imager is a CCD imager.

25. The image processing system of claim 21, wherein the first microlens covers exactly two pixels.

26. A method of forming an imager, the method comprising:
forming a plurality of pixel cells in a substrate, each pixel having a photosensor for generating charges in response to applied light;
forming a color filter array over the plurality of pixels and comprising a plurality of sets of color filters such that one color filter of the array covers each pixel, each set of color filters comprising at least three color filters respectively passing different wavelengths of visible light, the color filters for focusing light within a particular wavelength range on each of the underlying pixels; and
forming a microlens array comprising a plurality of microlenses formed over the color filter array such that each microlens covers more than one color filter and more than one underlying pixel, said microlens array comprising a first microlens covering a first color pattern of less than the at least three color filters in a set of color filters and a second microlens covering a second different color pattern of less than the at least three color filters in the set.

27. The method of claim 26, wherein forming a color filter array comprises forming a Bayer pattern color filter array of repeated Bayer sets of colored filters.

28. The method of claim 26, wherein the area of the formed pixels is less than 2 square micrometers.

29. The method of claim 26, wherein each microlens is formed in a shape that corresponds to a shape of the photosensors over which the microlens is formed.

30. The method of claim 26, wherein each of the formed microlenses has the same focal length.

31. The method of claim 26, wherein the first microlens covers exactly two pixels.

32. An imaging array comprising:
a color filter array comprising color filter patterns, a first color filter pattern comprising at least three color filters respectively passing different wavelengths of visible light; and
a micro lens array comprising sets of microlenses, a first set of microlenses corresponding to the first color filter pattern and having at least two microlenses with different respective focal lengths,
wherein the first set of microlenses comprises a plurality of microlenses each covering exactly two color filters.

33. An imaging array comprising:
an array of pixels, each pixel comprising a photosensor for collecting photocharge in response to light;

a color filter array arranged over the array photosensors and comprising color filter patterns, a first color filter pattern comprising at least three color filters respectively passing different wavelengths of visible light; and a micro lens array comprising sets of microlenses, a first set of microlenses comprising a first microlens corresponding to the first color pattern and having substantially the same shape as two or more photosensors arranged directly thereunder, wherein the first microlens covers exactly two color filters of said first color filter pattern.

* * * * *

UNITED STATES PATENT AND TRADEMARK OFFICE
CERTIFICATE OF CORRECTION

PATENT NO.         : 7,522,341 B2                                   Page 1 of 1
APPLICATION NO. : 11/178804
DATED              : April 21, 2009
INVENTOR(S)        : Chandra Mouli It is certified that error appears in the above-identified patent and that said Letters Patent is hereby corrected as shown below:

On the Title page, in Item (56), under "Other Publications", in column 2, line 3, delete "dooped" and insert -- doped --, therefor.

In column 7, line 12, in Claim 4, delete "micro lens" and insert -- microlens --, therefor.

In column 8, line 59, in Claim 32, delete "micro lens" and insert -- microlens --, therefor.

In column 9, line 6, in Claim 33, delete "micro lens" and insert -- microlens --, therefor.

Signed and Sealed this

Fourteenth Day of July, 2009

JOHN DOLL
*Acting Director of the United States Patent and Trademark Office*